(12) United States Patent
El-Kareh et al.

(10) Patent No.: US 8,415,720 B2
(45) Date of Patent: Apr. 9, 2013

(54) VERTICALLY PINCHED JUNCTION FIELD EFFECT TRANSISTOR

(75) Inventors: Badih El-Kareh, Bucheon-si (KR); Kyu Ok Lee, Yongin-si (KR); Joo Hyung Kim, Seoul (KR); Jung Joo Kim, Bucheon-si (KR)

(73) Assignee: Dongbu HiTek Co., Ltd., Seoul (KR)

( * ) Notice: Subject to any disclaimer, the term of this patent is extended or adjusted under 35 U.S.C. 154(b) by 134 days.

(21) Appl. No.: 13/172,036

(22) Filed: Jun. 29, 2011

(65) Prior Publication Data

US 2013/0001656 A1    Jan. 3, 2013

(51) Int. Cl.
*H01L 29/66*    (2006.01)

(52) U.S. Cl.
USPC ..... 257/272; 257/134; 257/274; 257/E31.073

(58) Field of Classification Search .................. 257/134, 257/272, 274, E31.073
See application file for complete search history.

(56) References Cited

U.S. PATENT DOCUMENTS 7,977,714 B2 *   7/2011   Ellis-Monaghan et al. .. 257/270

* cited by examiner

*Primary Examiner* — Tan N Tran
(74) *Attorney, Agent, or Firm* — Sherr & Jiang, PLLC

(57) ABSTRACT

A vertical junction field-effect transistor in a CMOS base-technology. The vertical junction field-effect transistor includes a semiconductor substrate having a source region and a drain region, a main-channel region formed between the source region and the drain region, a well region formed on the main-channel region between the source region and the drain region, vertical pinch-off regions formed at both source and drain ends or only on the source-end of the well region on the main-channel region in the source region and the drain region respectively, a source contact on the vertical pinch-off region in the source region, a drain contact on the vertical pinch-off region in the drain region, a gate contact on the well region between the source contact and the drain contact and shallow trench isolations formed on the well region.

20 Claims, 11 Drawing Sheets

Prior-art size

VJFET size

VERTICALLY PINCHED JUNCTION FIELD EFFECT TRANSISTOR

BACKGROUND

Complementary metal-oxide-semiconductor (CMOS) is a technology for constructing integrated circuits. CMOS technology has been used in digital logic circuits such as microprocessors, microcontrollers and static RAM. Recently, CMOS has received attention as a main-stream digital technology because of merits such as high degree integration, high performance, and low cost.

In CMOS, carriers are typically transported along a channel interface between gate dielectric and a substrate. Such a CMOS may be referred to as a surface-channel (SC) metal-oxide-semiconductor field-effect transistor (MOSFET), SC-N type metal-oxide-semiconductor (NMOS) or SC-P type metal-oxide-semiconductor (PMOS).

The channel interface may contain high-density traps, known as high density interface state, depending on the gate dielectric composition and process history. The high density interface state results in a relatively high flicker noise level. The flicker noise is also called low-frequency noise or 1/f noise where f is the frequency. High flicker noise is detrimental to most analog applications, in particular low-noise amplifiers.

Several methods have been used to reduce the flicker noise in analog CMOS. These methods include the use of "pure" oxide, appropriate annealing, incorporation of fluorine in the gate-oxide and at its interfaces, and/or the design of buried-channel (BC) MOSFETs, in particular BC PMOS. In a BCP-MOS, for example, a large fraction of the current passes below the surface, reducing the rate of interface trapping and de-trapping which results in noise.

Despite the above methods to reduce flicker noise in CMOS, the noise level remains too high for specific analog applications such as low-noise amplifiers (LNA). For such applications, the junction field-effect transistor (JFET) has been used due to its very low noise level. The low noise is achieved by directing the current path deep below a surface thereof and minimizing the fraction of current reaching the interface with dielectric (typically oxide). In a JFET, a channel is almost totally buried and sandwiched between two junctions acting as a gate, thus reducing the fraction of current near a dielectric interface.

FIG. 1 is a schematic cross-section of a typical NJFET structure.

The basic principles of JFET operation may be best understood by considering an n-channel JFET, or NJFET, as illustrated in FIG. 1. While an n-channel JFET is chosen for illustration throughout the disclosure, the description applies equally to a p-type JFET by reversing dopant and voltage polarities. FIG. 1 also shows silicide blocking layers (SAB) that isolate junctions from each other. Isolation can also be achieved by well-known shallow-trench isolation (STI).

The JFET operates similarly to a MOSFET, except that in a JFET, a field in a channel is exerted by p-n junctions while in a MOSFET a field is exerted in a channel by applying a predetermined voltage on a conductor gate separated from the channel by an insulator (e.g., gate oxide).

As illustrated in FIG. 1, source 1 and drain 2 are typically formed by implanting a CMOS source and drain into substrate 3. The gate includes top gate 4 and bottom p-type junctions 5 which are connected to each other and to gate contacts 11 through a PWELL 9, as illustrated in the top-view in FIG. 2. The top gate (4) typically includes PMOS source/drain in a base CMOS technology, and a lightly-doped extension 7. An NWELL 8 connects contacts 10 to the isolating deep NWELL or n-buried layer (DNWELL or NBL) region 13. A region between the top and bottom gates is doped lightly to form an NJFET channel 6 with an optimized thickness and dopant concentration that allows turning the channel on and off by the top and bottom gates.

For example, multiple parallel JFET structures of the type in FIG. 1 are illustrated in FIG. 2.

FIG. 3 is a schematic cross-section of an NJFET without applied bias on a gate or a drain with respect to a channel. FIG. 4 is a schematic cross-sectional view on an NJFET operating at bias-voltage conditions where the JFET operates in saturation. FIG. 5 is a schematic cross-sectional view of an NJFET biased in the off-condition, i.e., pinched-off at the source.

In case of FIG. 3, a conducting channel depth is $2a-2x_d$, where $2a$ is a distance between gate-channel metallurgical junctions and $x_d$ is the thermal-equilibrium depletion width at each junction (assumed uniform for simplicity).

Channel resistance can be modulated by applying a reverse bias or moderate forward bias to the gate with respect to the channel. With zero gate voltage or moderately forward-biased gate, the depletion boundaries at the source, shown as dash-dot lines, expand only a little into the channel so that the channel remains fully conducting at the source. As the drain reverse-voltage is gradually increased under this gate-bias condition, the drain current initially increases linearly with increasing drain voltage. As the reverse drain-voltage further increases, however, the depletion regions at the drain expand further and eventually merge as illustrated in FIG. 4. The merger point is referred to as the pinch-off point P. When the depletion regions at the drain merge, the current saturates and the JFET is said to operate above pinch-off, similarly to a MOSFET operating above pinch-off.

Applying a reverse-voltage on the gate reduces the conducting channel-thickness at both the source and drain, thus increasing the channel resistance and reducing the current. When the top and bottom depletion regions spread throughout the channel at the source, pinching-off the channel at the source as illustrated in FIG. 5, the drain current drops to a very low value and the channel is turned-off. The gate voltage at pinch-off at the source, $V_P$, depends on channel concentration and thickness. The pinch-off voltage $V_P$ of a JFET is directly related to its threshold voltage $V_T$.

Fabricating steps of a typical JFET are similar to those of a standard medium to high-voltage CMOS structure, except for the addition of an extra mask to form the JFET channel 6, bottom-gate 5, and p-type adjustment near the surface 7 in FIG. 1. Implantation of the bottom gate, JFET channel, and an eventual dopant near the surface are done during the same masking step. Regions 4 and 7 merge as one p-type gate region in FIG. 1. The PSD part of the top gate of an n-channel JFET is formed at the same time as the PMOS source and drain in CMOS. The NJFET source and drain contacts are formed at the same time as the NMOS source and drain in CMOS. The CMOS NWELL 8 constitutes the connection between n+ contacts 10 and deep NWELL (DNWELL) or N-buried layer (NBL) 13, as illustrated in FIG. 1. The CMOS PWELL 9 ensures the connection of the top gate 4 and bottom gate 5, and the connection of top p-contact 11 and bottom gate 5. Thus, the NJFET requires only one additional mask to a base CMOS process. Such a related fabricating method is presently adopted in high-performance analog technologies.

The JFET, however, has draw backs of large size and limited current-carrying capability while it exhibits a very low flicker-noise level. The channel concentration must satisfy a low pinch-voltage, typically in the range 1.0-2.0V, and a related optimized drain current. Once the pinch-voltage is fixed, the combination of channel depth and concentration are also fixed, determining the drain current.

For a JFET with top and bottom gates, the channel resistance, $R_{Ch}$, per unit width is given as the following Equation 1:

$$R_{Ch} = \overline{\rho}\frac{L}{S} = \frac{\overline{\rho}L}{2W(a-x_d)} \text{ Ohm-}\mu\text{m,} \quad \text{Eq. 1}$$

where $\overline{\rho}$ is the effective channel resistivity given as follows in Equation 2:

$$\overline{\rho} = \frac{1}{q\overline{\mu}_n N_D} \text{ Ohm-cm,} \quad \text{Eq. 2}$$

L is the channel length, and S the cross-sectional area given by $2W(a-x_d)$. a is half the distance between metallurgical junctions, and $x_d$ the gate-channel junction depletion-width, as illustrated in FIG. 3. The total pinch-voltage (including the built-in voltage) is as follows in Equation 3:

$$V_P = \frac{q\overline{N_D}a^2}{2\varepsilon_{Si}} V, \quad \text{Eq. 3}$$

Where $\overline{N_D}$ is the effective channel concentration and $\varepsilon_{Si}$ the silicon permittivity ($=11.7\times8.86\times10^{-14}$ F/cm). It can be seen from the above equations that, for a given channel depth $2a$, when $V_p$ is fixed, $\overline{N_D}$ and thus $R_{Ch}$ are also fixed. Also, because of the requirement on low channel concentration (low pinch-voltage), a minimum length L is needed to avoid short-channel effects.

In summary, the JFET suffers from its large size and limited current-carrying capability.

SUMMARY

Embodiments relate to semiconductor technologies, and more particularly, to a vertical junction field-effect transistor (VJFET) in a CMOS based-technology.

Embodiments relate to a vertical junction field-effect transistor (VJFET) that is configured to pinch-off a channel vertically rather than horizontally, decouple a pinch-region from a main channel-region, and allow a considerably higher main-channel concentration to reduce the channel resistance, thereby increasing the JFET current-carrying capability.

In accordance with embodiments, the vertical pinch-off region can be formed on both source and drain ends of the channel or only at the source end.

Embodiments relate a vertical junction field-effect transistor (VJFET) having high channel concentration that considerably reduces short-channel effects and allows the design of comparatively smaller-size JFETs than in the prior art.

Embodiment relate a vertical junction field-effect transistor (VJFET) having a structure that can be incorporated in an existing CMOS technology in a simple fashion with only one added masking step.

In accordance with embodiments, a junction field-effect transistor includes at least the following: a main-channel region formed between a source region and a drain region in a semiconductor substrate, a well region formed on and/or over the main-channel region between the source region and the drain region, vertical pinch-off regions formed at both ends of the well region on and/or over the main-channel region in the source region and the drain region respectively, a source contact on and/or over a top of the vertical pinch-off region in the source region, a drain contact on and/or over a top of the vertical pinch-off region in the drain region, a gate contact on and/or over a top of the well region between the source contact and the drain contact, and shallow trench or silicide-block isolations formed on and/or over the well region and isolating the source contact, the drain contact, and the gate contact from each other.

The vertical pinch-off regions may be independent elements separated from the main-channel region. The vertical pinch-off regions may contact the source, drain, and gate contacts and the well region. The vertical pinch-off regions may electrically connect the main-channel region and the source and drain contacts. A conductivity type of the main-channel region may be an n-type, a conductivity type of the well region may be a p-type, and the vertical pinch-off regions may be lightly-doped n-type region.

The well region may act as a gate and is connected to the gate contact. The main-channel region may be electrically connected through the vertical pinch-off regions and the main-channel region may be formed by implanting a deep n-type well or forming a highly-doped n-type buried layer. The source and drain regions may have a conductivity type identical to that of the vertical pinch-off regions and the main-channel region, and the well region may have a conductivity type different from that of the source and drain regions.

The junction field-effect transistor may further include a silicon-on-insulator layer isolating the active regions from the rest of the semiconductor substrate. The silicon-on-insulator layer may be a buried oxide layer. The junction field-effect transistor may further include silicide blocks formed between the gate contact and the source contact and between the gate contact and the drain contact. The gate contact, the source contact, and the drain contact may be separated by the silicide blocks. The junction field-effect transistor may have a current-carrying capability larger than about 500 μA per μm width. A length of the main-channel region may be designed to minimum dimensions allowed by a typical CMOS technology.

DRAWINGS

Figure 1:
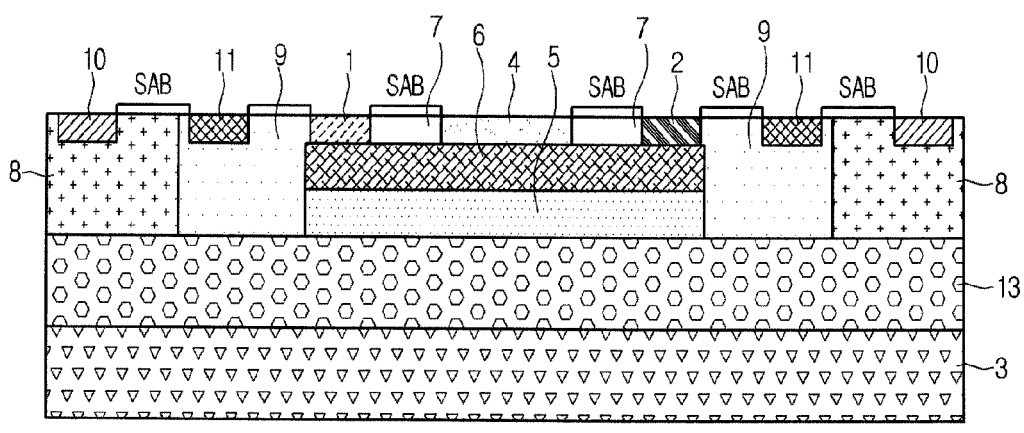
FIG. 1 illustrates a schematic cross-section of a typical NJFET structure.
Figure 2:
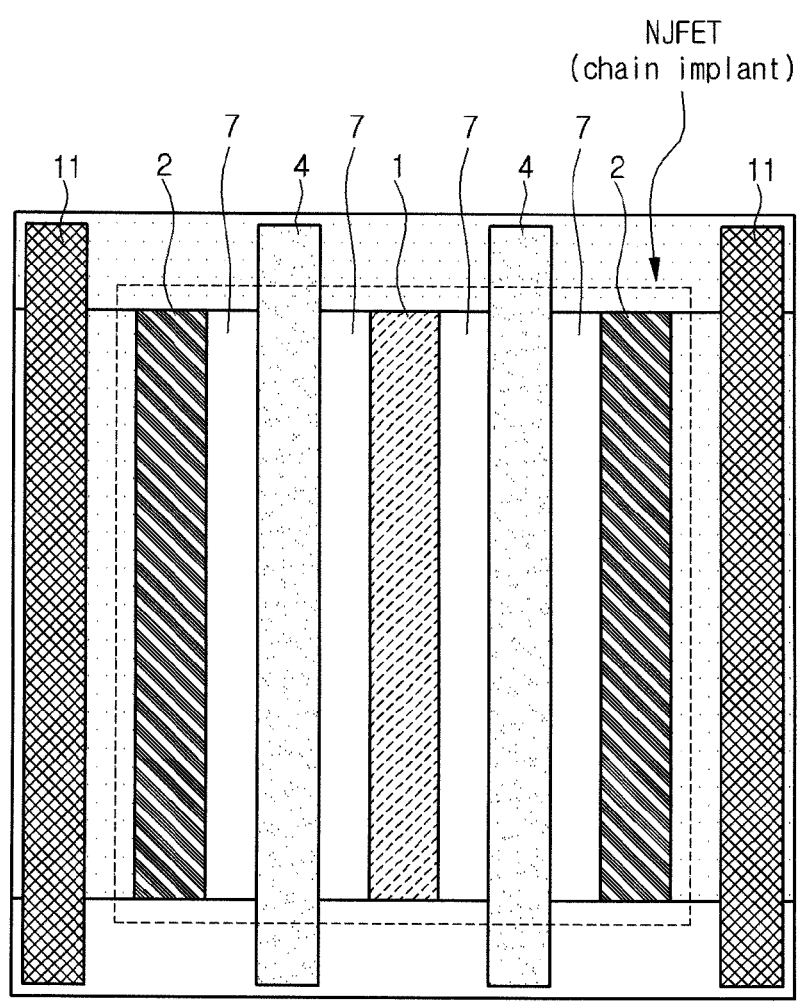
FIG. 2 illustrates a plan-view of multiple NJFET structures of the type shown in FIG. 1.
Figure 3:
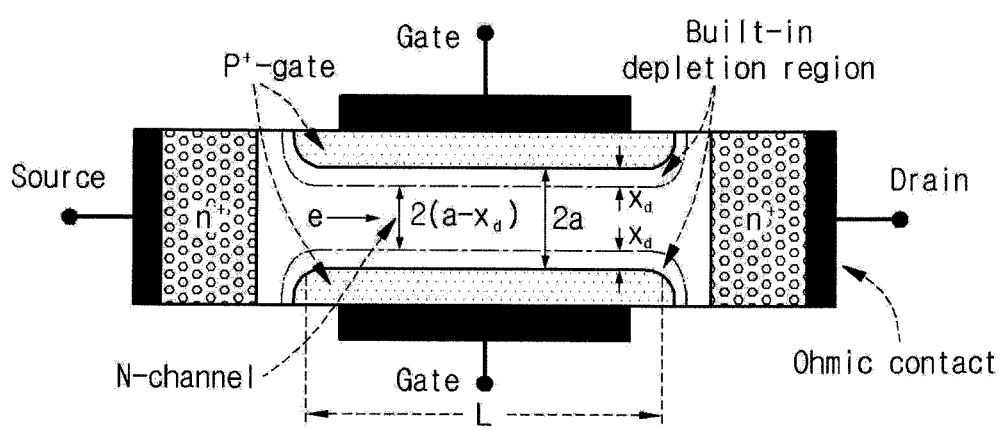
FIG. 3 illustrates a detailed schematic cross-sectional view of an NJFET used to describe the different regions under thermal-equilibrium conditions, i.e., without applied voltage on any terminal.
Figure 4:
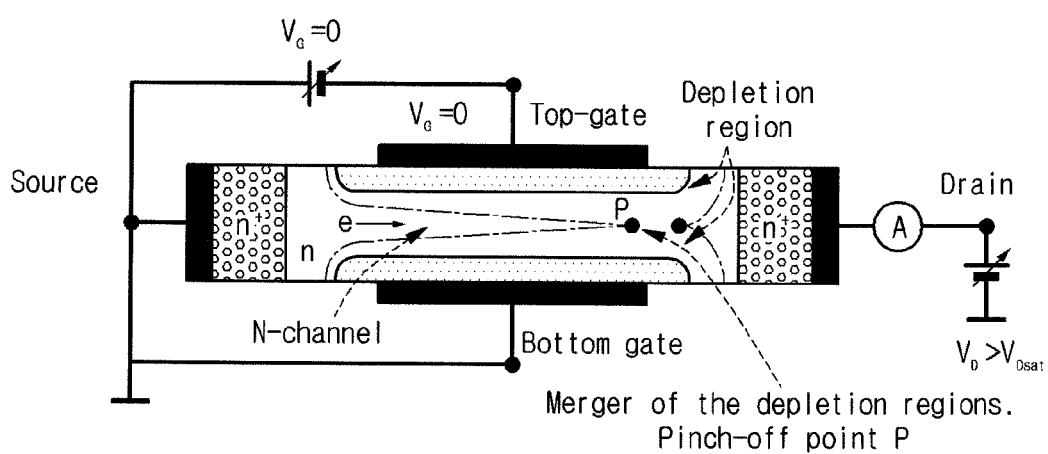
FIG. 4 illustrates a schematic cross-sectional view on an NJFET operating at bias-voltage conditions where the JFET operates in saturation.
Figure 5:
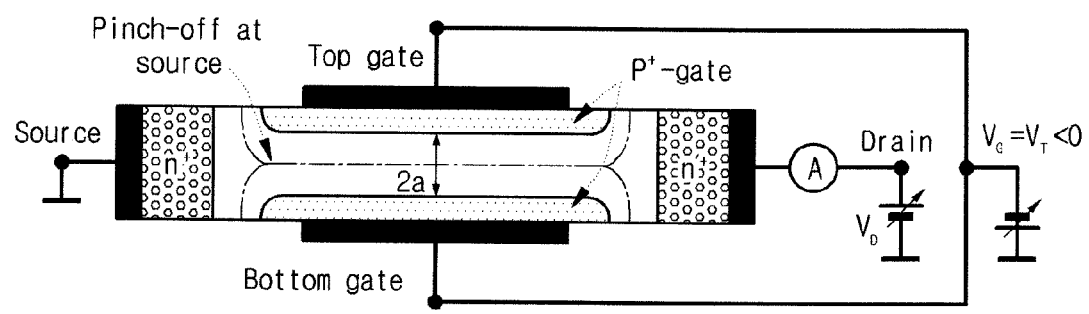
FIG. 5 illustrates a schematic cross-sectional view of an NJFET biased in the off-condition, i.e., pinched-off at the source.
Figure 6:
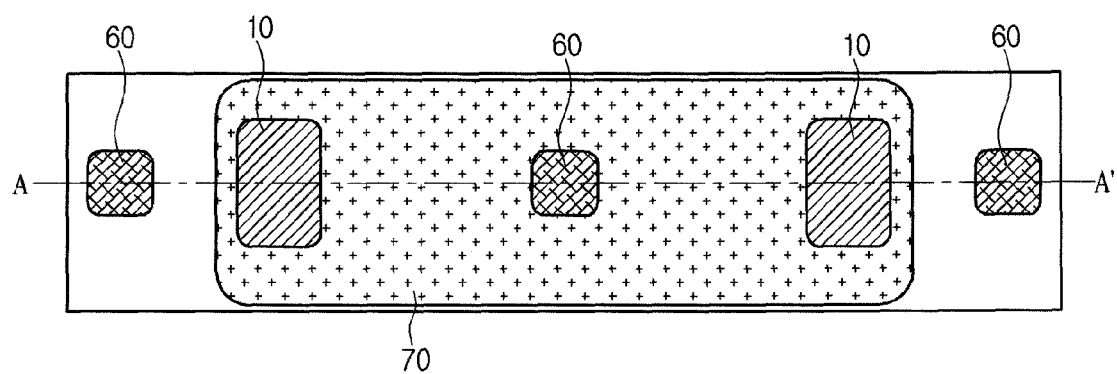

Example FIG. 6 illustrates a top view of a vertical junction field effect transistor (VJFET), in accordance with embodiments.

Figure 7:
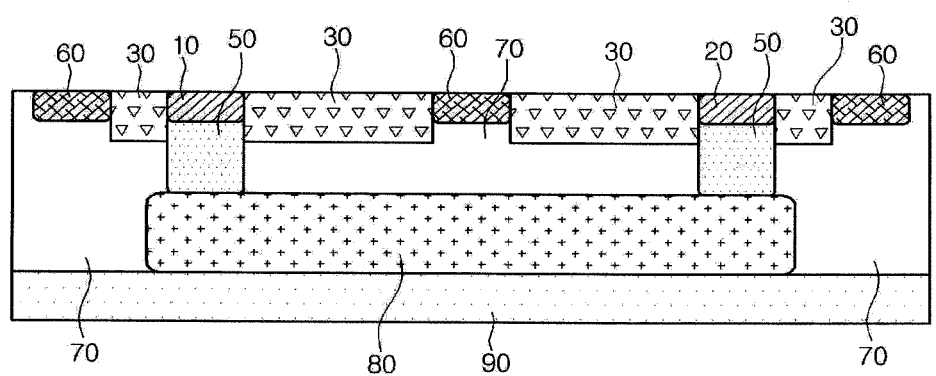

Example FIG. 7 illustrates a schematic cross-section taken along a line A-A' in example FIG. 6, illustrating STI isolating the junctions from each-other, in accordance with embodiments.

Figure 8:
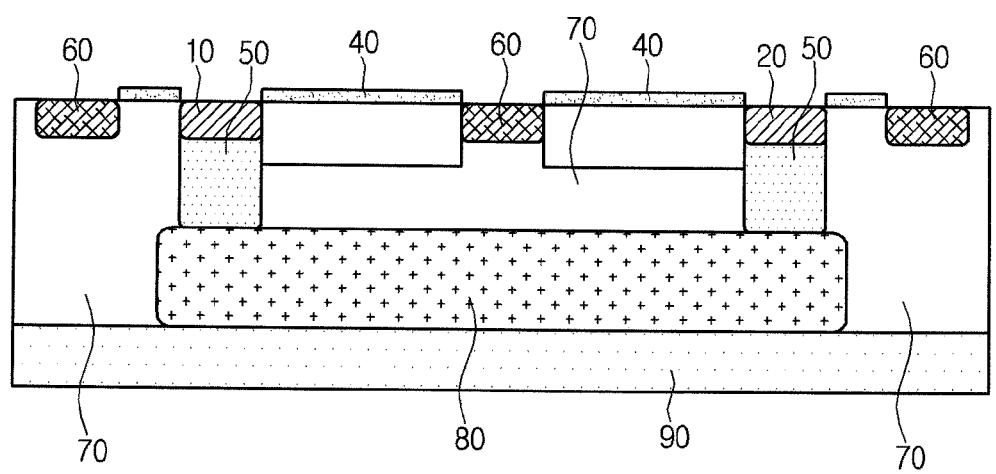

Example FIG. 8 illustrates a schematic cross-section taken along a line A-A' in example FIG. 6, with silicide block (SAB or SBLK) isolating the junctions from each-other, in accordance with embodiments.

Figure 9A:
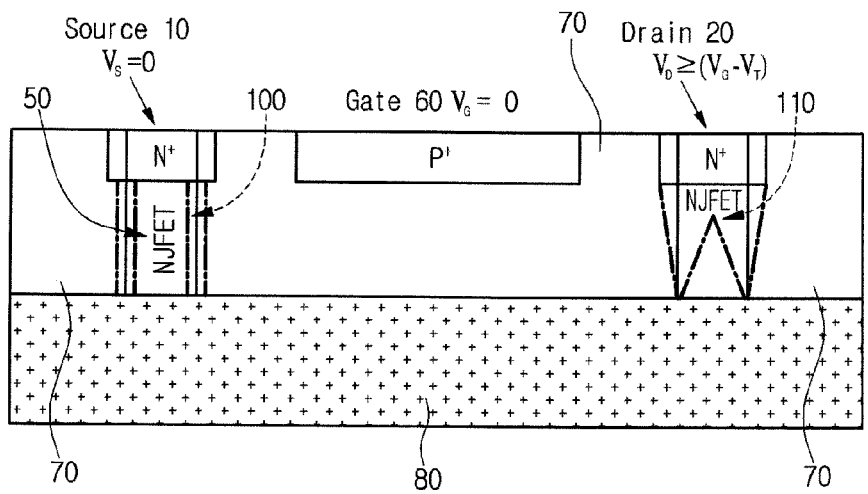
Figure 9B:
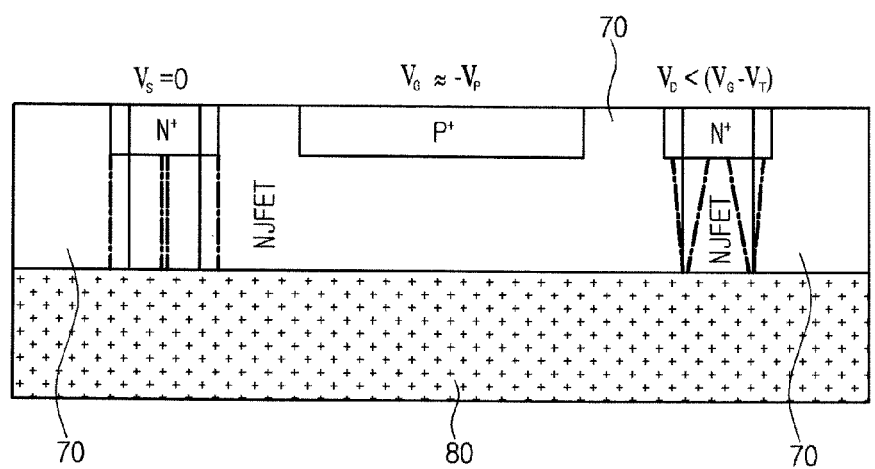

Example FIGS. 9A and 9B illustrate a detailed schematic cross-section of a vertically-pinched NJFET, in accordance with embodiments.

Figure 10:
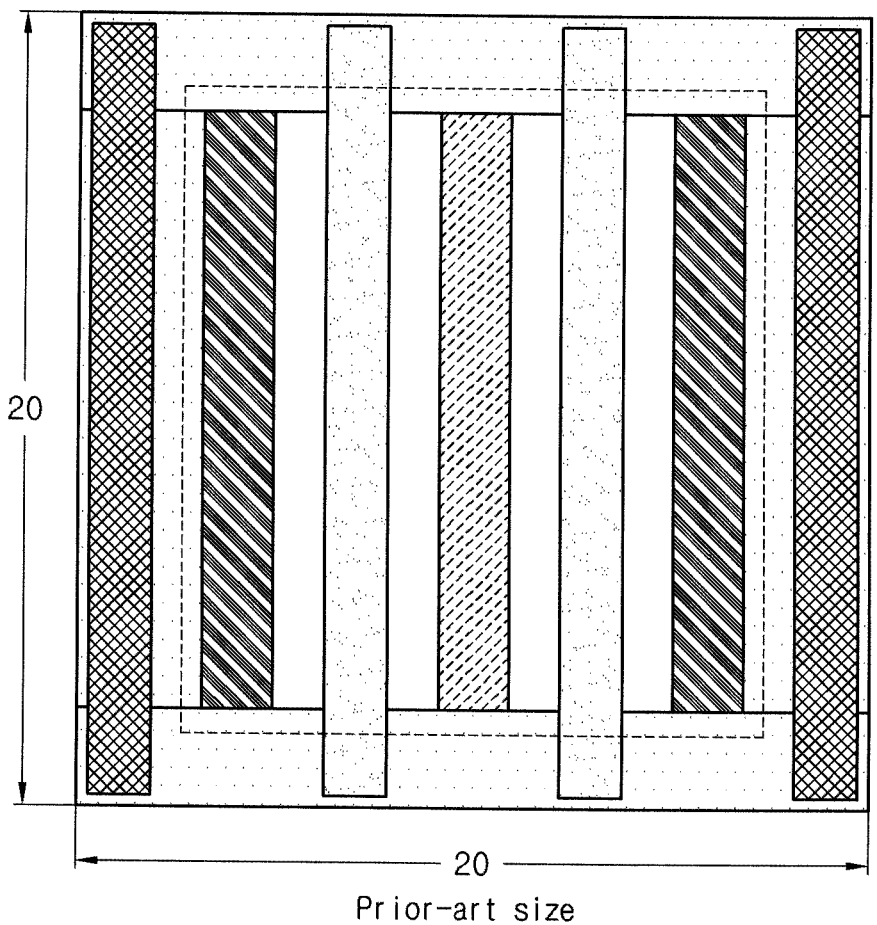
Figure 10:
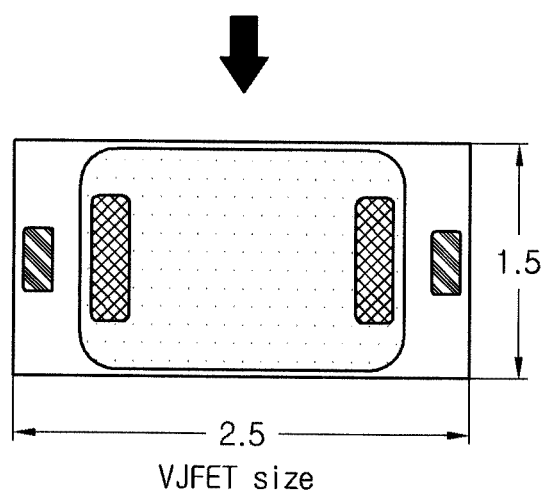

Example FIG. 10 is a diagram that illustrates comparison of sizes of two NJFETs having the same current-carrying capability, one designed in the prior art and the other in the embodiments.

Figure 11:
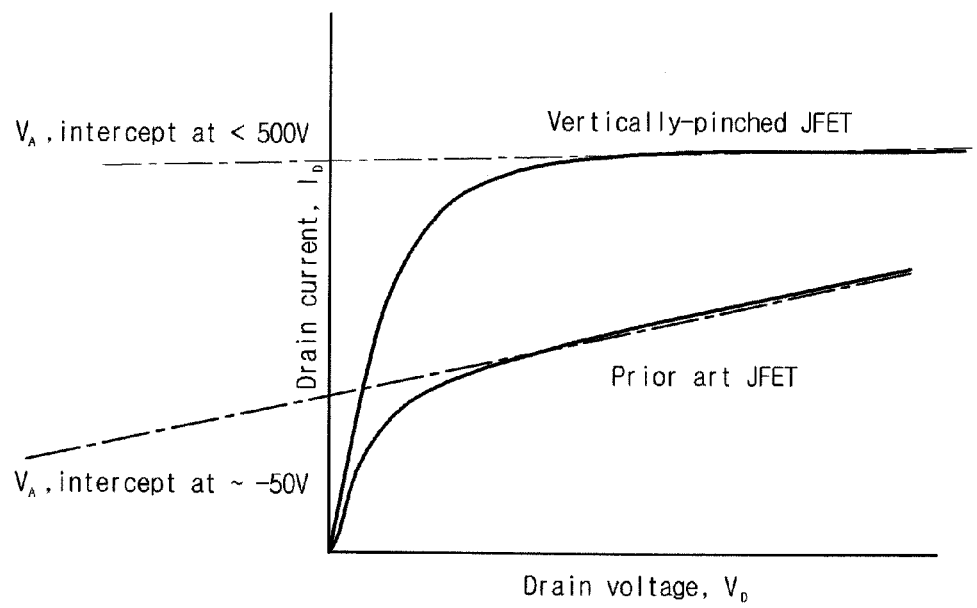

Example FIG. 11 is a graph that illustrates comparison of the estimated Early voltage, $V_A$, of a prior art NJFET to that in embodiments for the same channel length.

DESCRIPTION

A vertically-pinched junction field-effect transistor (VJFET) constructed in a CMOS base technology in accordance with embodiments will be described in detail with reference to the accompanying drawings.

Example FIG. 6 illustrates a top view of a vertically-pinched junction field-effect transistor in accordance with embodiments. Example FIG. 7 shows cross section across the line A-A' of example FIG. 6. Example FIG. 8 is a schematic cross-section taken along a line A-A' in example FIG. 6, with silicide block (SAB or SBLK) isolating the junctions from each-other.

The vertically-pinched junction field-effect transistor (JFET) of example FIGS. 6 through 8 may be constructed in a CMOS technology. Particularly, example FIGS. 6 through 8 illustrate an n-channel vertically-pinched junction field effect transistor (JFET).

As illustrated in example FIGS. 6 through 8, the n-channel vertically pinched JFET may include a plurality of doping regions provided in an active region for forming a main channel, a gate, a vertical pinch-off region, and a JFET source-drain. Example FIGS. 6 through 8 illustrate an n-channel junction field-effect transistor (NJFET) fabricated on and/or over a p-type wafer. A p-channel junction field-effect transistor (PJFET) similar to that illustrated in example FIGS. 6 and 7 can be constructed by appropriate change in dopant polarities.

The n-channel vertically-pinched JFET may include silicon-on-insulator (SOI) 90, a semiconductor substrate formed on and/or over the SOI 90, as illustrated in FIG. 7. The n-channel vertically-pinched JFET may include a main-channel region 80 between a source region and a drain region in the semiconductor substrate, and a p-well region 70 formed on and/or over the main-channel region 80 between the source region and the drain region.

The n-channel vertically-pinched JFET may include vertical pinch-off regions formed at both ends of the p-well region 70 on the main-channel region 80 in the source/drain regions respectively. The vertical pinch-off regions 50 are separated from each other by the p-well region 70 which acts as the gate. The vertical pinch-off regions 50 may be lightly-doped n-type region.

The n-channel vertically-pinched JFET may include a source contact 10 on and/or over a top of the vertical pinched-off region 50 in the source region, a drain contact 20 on and/or over a top of the vertically-pinched region 50 in the drain region, and a gate contact 60 is formed on and/or over a top of the p-well region 70. The gate contact 60 can be placed anywhere between the source contact 10 and the drain contact 20 or outside the contacts.

Shallow trench isolations (STI) 30 are formed on and/or over the p-well region 70 between the source contact 10 and the gate contact 60 and between the drain contact 20 and the gate contact 60. Accordingly, all contacts are isolated from each other by the STIs 30.

Further, as illustrated in example FIG. 8, the n-channel vertically pinched JFET may further include silicide-blocks (SAB or SBLK) 40 between the gate contact 60 and the source contact 10 and between the gate contact 60 and the drain contact 20. Accordingly, all contacts are isolated from each other by the SBLK 40.

As illustrated in FIGS. 6 through 8, the vertical pinch-off region 50 contact the source and drain contacts 10 and 20, the gate contact 60, and the P-well region 70. The p-well region 70 acts as a gate and is connected to the gate contact 60. The main-channel region 80 is connected to the source/drain contact 10 and 20 through the vertical pinch-off regions 50. The main-channel region 80 may be formed by either implanting the deep NWELL (DNWELL) or by forming a highly-doped n-buried layer (NBL) followed by epitaxy. The silicon-on-insulator (SOI) 90 may be a buried oxide layer.

The vertical pinch-off region 50 makes an electric connection between the main channel 80 and source/drain contacts 10 and 20. The vertical pinch-off region 50 may be a lightly-doped n-type region. The gate contact 60 may be formed in the p-well region 70. The n-type structures may include P, As, and/or Sb dopant atoms therein. The gate 70 may have a p-type well structure. The gate contact 60 is formed in the gate well 70. The p-type structures may include B dopant atoms therein.

The source and drain regions 10 and 20 may have the same conductivity type as the vertically-pinch regions 50 and main-channel region 80. The gate 70 may have a different conductivity type from the source and drain regions 10 and 20, the vertical pinched off region 50 and the main-channel region 80. The structure can be vertically isolated by a buried oxide (BOX) layer 90 in an SOI CMOS-based technology. Several gate contacts 60 are illustrated in example FIGS. 6 through 8. Only one contact, however, is required for placement at an appropriate position with respect to source and drain since the gate does not carry appreciable current.

The main features of embodiments are the vertical pinched off region 50 and the low-resistivity main-channel region 80 that is formed independently of the vertical pinch off region 50.

A method of vertical pinching and its advantage will be described with reference to example FIGS. 9A and 9B. Example FIG. 9A illustrates conducting in a saturation mode, and example FIG. 9B illustrates non-conducting (turned-off). When zero voltage is applied to the gate and source, depletion boundaries 100 at the source are at their thermal-equilibrium position and the vertical pinch off region 50 conducts almost fully. As the voltage at the drain 20 is increased, the current initially increases linearly. It is essentially limited by the resistances of the vertical pinched off regions 50 since the resistance of the main-channel region 80 is practically negligible when compared to the vertical resistance of vertical pinched off regions 50.

The resistance of vertical pinched off regions 50 can be optimized by proper choice of dopant concentration, depth, width and length. As the drain voltage increases, depletion boundaries 110 eventually merge at the drain 20. This is referred to as pinch-off at the drain 20. The n-channel vertically pinched JFET then operates in the saturation mode. The voltage necessary to pinch-off the region, the pinch-off voltage $V_P$, can be optimized to 1-2V. The total channel resistance in the saturation mode is estimated as about 5000 Ohm for about a 1×2 μm² source/drain contact areas. At a drain bias of 5V, this results in approximately 1 mA (assuming a highly-doped main-channel region). By separately forming the vertical pinched off region and the main-channel region, allowing a considerably higher main-channel concentration, not only the channel resistance drops considerably, but also results in a substantial increase in Early voltage, $V_A$.

Example FIG. 10 is a diagram that illustrates a comparison of sizes of two n channel JFETs having the same current-carrying capability, one designed in the prior art and the other in accordance with embodiments. Example FIG. 11 is a graph that illustrates an estimated comparison of the Early voltage, $V_A$, of a typical n-channel JFET to that in accordance with embodiments for the same channel length.

As illustrated in example FIG. 10, a transistor size in accordance with embodiments is compared to that in the prior art. A considerable reduction in transistor size can be obtained in accordance with the embodiments.

As illustrated example FIG. 11 the Early voltage, $V_A$, of the typical n-channel JFET is compared to that in accordance with embodiments for the same channel length. Here again, a considerably shorter channel than in the prior art can be obtained.

Another advantage of the vertically-pinched JFET in accordance with embodiments is the lower noise. Since a majority of the current is directed away from silicon-dielectric (oxide) interfaces, the flicker noise level can be very low. The vertically-pinched JFET in accordance with embodiments will be described in more detail below. In the following description, the first conductivity type is n-type and the second conductivity type is p-type.

A semiconductor substrate may include a first conductivity type main-channel region 90, vertical pinch off region 50, a source contact 10, a drain contact 20, a second conductivity type gate well 70, and a gate contact 60. The source 10, the drain 20, and the main-channel region 80 may be defined as a first doping region, and the gate region 70 and gate contact 60 may be defined as a second doping region.

The JFET source contact 10 and drain contact 20 may be formed at the same time as the CMOS source and drain in a base CMOS technology. Similarly, the gate 70 and main channel region 80 may be formed at the same time as the PWELL and deep NWELL (or NBL) in a base CMOS process. The vertical-pinched off region 50 may be doped uniformly during epitaxial growth or by a chain-implant process. The buried-oxide region 90 enhances CMOS performance and facilitates isolation but is not crucial to the disclosure. It would be used if the CMOS base-process is constructed on Silicon-On-Insulator (SOI).

As has been described herein, the NJEFT manufactured using a CMOS technology has at least the following advantages. Since the vertical pinched off region is decoupled from the main-channel region, a highly-doped main-channel region can be achieved, thereby reducing the channel resistance and increasing the JFET current-carrying capability. Additionally, the high concentration in the main-channel region allows the design of a considerably shorter channel length than that in the prior art, thus reducing the overall size of the structure. Also, the fact that most of the current is directed below the surface reduces the flicker noise (1/f noise) level.

Although embodiments have been described herein, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art. In particular, the vertically pinched-off region can be formed only under the source contact and not under the drain contact, reducing the overall resistance of the channel.

What is claimed is:

1. A junction field-effect transistor comprising:
    a semiconductor substrate;
    a source region and a drain region in the semiconductor substrate;
    a main-channel region formed between the source region and the drain region;
    a well region formed on the main-channel region between the source region and the drain region;
    vertical pinch-off regions formed at both ends of the well region on the main-channel region in the source region and the drain region respectively;
    a source contact on the vertical pinch-off region in the source region;
    a drain contact on the vertical pinch-off region in the drain region;
    a gate contact on the well region between the source contact and the drain contact; and
    shallow trench isolations formed on the well region and configured to isolate the source contact, the drain contact, and the gate contact from each other.

2. The junction field-effect transistor of claim 1, wherein the vertical pinch-off regions are independent elements separated from the main-channel region.

3. The junction field-effect transistor of claim 2, wherein the vertical pinch-off regions are configured to contact the source region, the drain region, the gate contact and the well region.

4. The junction field-effect transistor of claim 2, wherein the vertical pinch-off regions electrically connect the main-channel region and the source contact and the drain contact.

5. The junction field-effect transistor of claim 1, wherein a conductivity type of the main-channel region is an n-type, a conductivity type of the well region is a p-type, and the vertical pinch-off regions are lightly-doped n-type region.

6. The junction field-effect transistor of claim 1, wherein the well region is configured to act as a gate and is connected to the gate contact.

7. The junction field-effect transistor of claim 1, wherein the main-channel region is electrically connected through the vertical pinch-off regions.

8. The junction field-effect transistor of claim 1, wherein the main-channel region is formed by implanting a deep n-type well.

9. The junction field-effect transistor of claim 1, wherein the main-channel region is formed by forming a highly-doped n type buried layer.

10. The junction field-effect transistor of claim 1, wherein the source region and the drain region each have a conductivity type identical to that of the vertical pinch-off regions and the main-channel region.

11. The junction field-effect transistor of claim 1, wherein the well region has a conductivity type different from that of the source region and the drain region.

12. The junction field-effect transistor of claim 1, further comprising a silicon-on-insulator layer under the semiconductor substrate.

13. The junction field-effect transistor of claim 12, wherein the silicon-on-insulator layer comprises a buried oxide layer.

14. The junction field-effect transistor of claim 1, further comprising silicide blocks formed between the gate contact and the source contact and between the gate contact and the drain contact.

15. The junction field-effect transistor of claim 14, wherein the gate contact, the source contact, and the drain contact are separated by the silicide blocks.

16. The junction field-effect transistor of claim 1, wherein the junction field-effect transistor has a current-carrying capability larger than about 500 μA per μm width.

17. An apparatus comprising:
a semiconductor substrate having a source region and a drain region;
a silicon-on-insulator layer under the semiconductor substrate;
a main-channel region formed between the source region and the drain region;
a well region formed on the main-channel region between the source region and the drain region;
vertical pinch-off regions formed at one of both source and drain ends and only at the source-end of the well region on the main-channel region in the source region and the drain region respectively;
a source contact on the vertical pinch-off region in the source region;
a drain contact on the vertical pinch-off region in the drain region;
a gate contact on the well region between the source contact and the drain contact; and
silicide blocks formed between the gate contact and the source contact and between the gate contact and the drain contact and configured to separate the gate contact, the source contact, and the drain contact from each other.

18. The apparatus of claim 17, wherein the apparatus comprises a junction field-effect transistor.

19. An apparatus comprising:
a semiconductor substrate having a source region and a drain region;
a silicon-on-insulator layer under the semiconductor substrate;
a main-channel region formed between the source region and the drain region;
a well region formed on the main-channel region between the source region and the drain region;
vertical pinch-off regions formed at one of both source and drain ends and only at the source-end end of the well region on the main-channel region in the source region and the drain region respectively;
a source contact on the vertical pinch-off region in the source region;
a drain contact on the vertical pinch-off region in the drain region;
a gate contact on the well region between the source contact and the drain contact;
shallow trench isolations formed on the well region; and
silicide blocks formed between the gate contact and the source contact and between the gate contact and the drain contact and configured to separate the gate contact, the source contact, and the drain contact from each other,
wherein the vertical pinch-off regions are configured to contact the source region, the drain region, the gate contact and the well region and also electrically connect the main-channel region and the source contact and the drain contact.

20. The apparatus of claim 19, wherein the apparatus comprises a junction field-effect transistor.

* * * * *